(12) United States Patent
Sano

(10) Patent No.: US 12,500,178 B2
(45) Date of Patent: Dec. 16, 2025

(54) FLEXIBLE SUBSTRATE

(71) Applicant: Magnolia White Corporation, Tokyo (JP)

(72) Inventor: Takumi Sano, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 448 days.

(21) Appl. No.: 18/192,725

(22) Filed: Mar. 30, 2023

(65) Prior Publication Data

US 2023/0326865 A1   Oct. 12, 2023

(30) Foreign Application Priority Data

Apr. 6, 2022   (JP) .................................. 2022-063344

(51) Int. Cl.
*H01L 23/538*   (2006.01)

(52) U.S. Cl.
CPC ...... *H01L 23/5387* (2013.01); *H01L 23/5386* (2013.01)

(58) Field of Classification Search
CPC .................................................. H01L 23/5387
USPC ....................................................... 257/668
See application file for complete search history.

(56) References Cited

U.S. PATENT DOCUMENTS

| | | |
|---|---|---|
| 2015/0282294 A1 | 10/2015 | Wakuda et al. |
| 2015/0282296 A1 | 10/2015 | Ogura et al. |
| 2015/0382457 A1* | 12/2015 | Tomita ................. H05K 1/0283 174/254 |
| 2017/0181276 A1* | 6/2017 | Sawada ................... B32B 27/38 |
| 2021/0013431 A1* | 1/2021 | Kawata .................... H05K 1/02 |
| 2021/0289621 A1* | 9/2021 | Sano .................... H05K 1/0283 |
| 2022/0087008 A1* | 3/2022 | Sano ..................... G06F 3/0446 |

FOREIGN PATENT DOCUMENTS

JP   2017-113088 A   6/2017

* cited by examiner

*Primary Examiner* — Ajay Arora
(74) *Attorney, Agent, or Firm* — Michael Best & Friedrich LLP (57) ABSTRACT

According to one embodiment, a flexible substrate including an insulating base including first and second strip portions, and island-shaped portions, electrical elements, scanning lines, signal lines, a first inorganic insulating film covering the scanning lines, and a second inorganic insulating film covering the signal lines, each of the scanning lines includes a first side edge and a second side edge, the first inorganic insulating film covers the first side edge and the second side edge, each of the signal lines includes a third side edge and a fourth side edge, and the second inorganic insulating film covers the third side edge and the fourth side edge.

7 Claims, 8 Drawing Sheets

FLEXIBLE SUBSTRATE

CROSS-REFERENCE TO RELATED APPLICATIONS

This application is based upon and claims the benefit of priority from Japanese Patent Application No. 2022-063344, filed Apr. 6, 2022, the entire contents of which are incorporated herein by reference.

FIELD

Embodiments described herein relate generally to a flexible substrate.

BACKGROUND

In recent years, the use of flexible substrates with flexibility and elasticity has been studied in various fields. For example, such use can be considered that a flexible substrate with electrical elements arrayed in a matrix shape is attached to a curved surface such as of the housing of an electronic device, human body or the like. As electrical elements, various sensors such as touch sensors and temperature sensors, display elements and the like can be applied.

In flexible substrates, it is necessary to take measures to prevent the wiring from being damaged by stress caused by bending or stretching. As such measures, for example, it has been proposed to provide honeycomb-shaped openings in the base that supports the wiring or to shape the wiring into a meandering manner (meander shape).

DETAILED DESCRIPTION

In general, according to one embodiment, a flexible substrate comprises an insulating base including a plurality of first strip portions extending along a first direction and aligned along a second direction which intersects the first direction, a plurality of second strip portions extending along the second direction and aligned along the first direction, and a plurality of island-shaped portions located at respective intersections of the first strip portions and the second strip portions, a plurality of electrical elements overlapping the island-shaped portions, respectively, a plurality of scanning lines each extending while overlapping the respective first strip portion, a plurality of signal lines each extending while overlapping the respective second strip portion, a first inorganic insulating film covering the scanning lines and a second inorganic insulating film covering the signal lines, and the first inorganic insulating film is formed into a strip shape which overlaps the first strip portions, the second inorganic insulating film is formed into a strip shape which overlaps the second strip portions, each of the scanning lines includes a first side edge and a second side edge extending in an extending direction of the scanning lines, and the first inorganic insulating film covers the first side edge and the second side edge, each of the signal lines includes a third side edge and a fourth side edge extending in an extending direction of the signal lines, and the second inorganic insulating film covers the third side edge and the fourth side edge.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and an overlapping detailed description thereof is omitted unless otherwise necessary.

Figure 1:
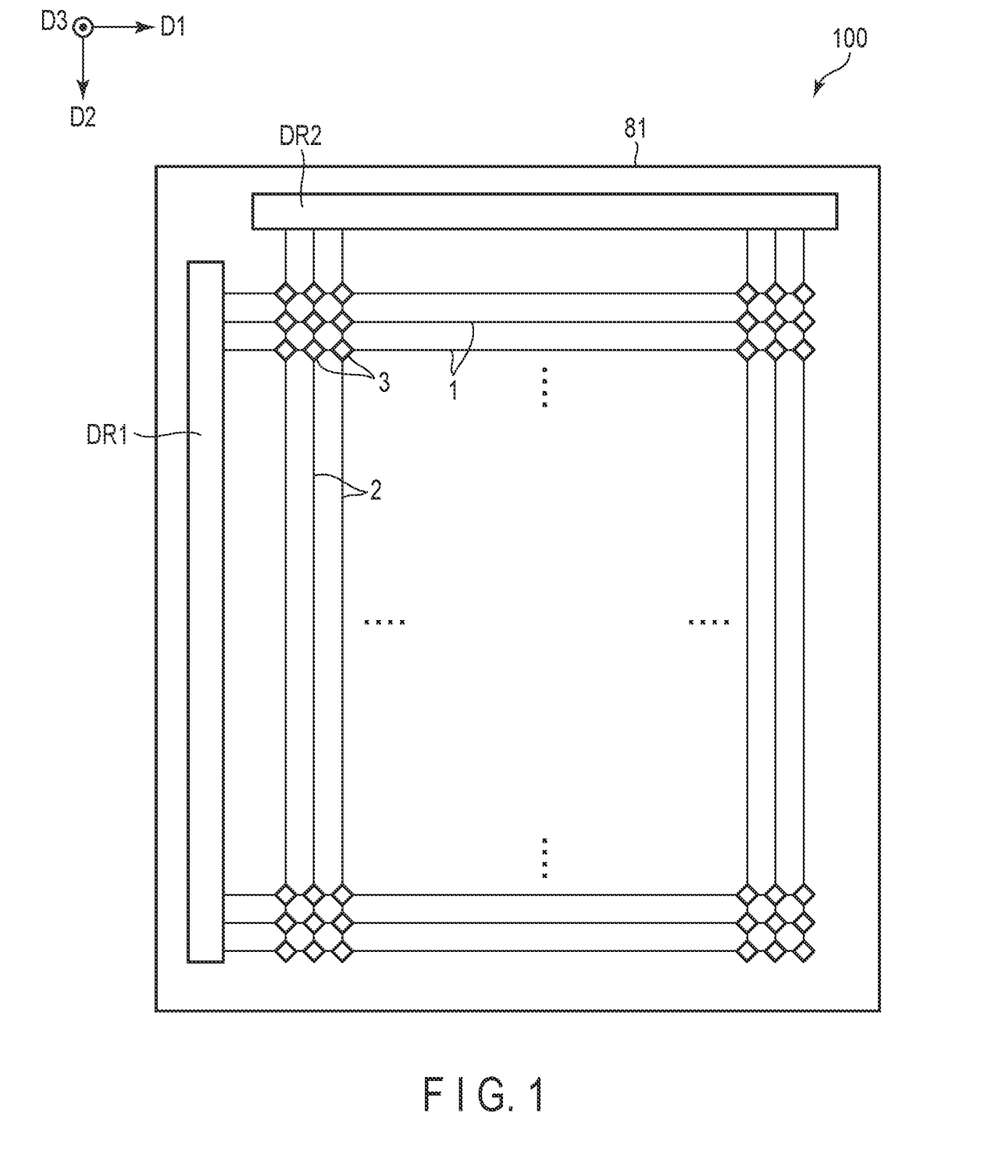
FIG. 1 is a plan view schematically showing a flexible substrate according to an embodiment.

FIG. 1 is a plan view schematically showing a flexible substrate 100 according to the embodiment.

In this embodiment, a first direction D1, a second direction D2 and a third direction D3 are defined as shown in the figure. The first direction D1 and the second direction D2 are parallel to a main surface of the flexible substrate 10 and intersect each other. The third direction D3 is perpendicular to the first direction D1 and the second direction D2, and equivalent to the thickness direction of the flexible substrate 100. The first direction D1 and the second direction D2 intersect normal to each other in this embodiment, but they may intersect at an angle other than normal. In this specification, the direction toward the tip of the arrow indicating the third direction D3 is referred to as "upwards" and the direction from the tip of the arrow to the opposite direction is referred to as "downward". Further, it is assumed that there is an observation position for observing the flexible substrate 100 on the tip side of the arrow indicating the third direction D3, and viewing from this observation position toward a D1-D2 plane defined by the first direction D1 and the second direction D2 is called a plan view.

As shown in FIG. 1, the flexible substrate 100 includes a plurality of scanning lines 1, a plurality of signal lines 2, a plurality of electrical elements 3, a resin layer 81, a scanning line driver DR1 and a signal line driver DR2. The scanning lines 1, the signal lines 2, the electrical elements 3, the scanning line driver DR1 and the signal line driver DR2 are located on the resin layer 81.

The scanning lines 1 each extend along the first direction D1 and aligned along the second direction D2. The scanning lines 1 are each connected to the scanning line driver DR1. The signal lines 2 each extend along the second direction D2 and aligned along the first direction D1. The signal lines 2 are each connected to the signal line driver DR2. The electrical elements 3 are each located at an intersection between each scanning line 1 and each respective signal line 2 and are electrically connected to the scanning lines 1 and the signal lines 2, respectively.

To the electrical elements 3, scanning signals are supplied via the scanning lines 1, respectively. For example, if the electrical elements 3 are of a type such as sensors which output a signal, the output signal from each electrical element 3 is supplied to the respective signal line 2. Note that the scanning lines 1 and the signal lines 2 are examples of the wiring lines provided in the flexible substrate 100. In addition to the scanning lines 1 and signal lines 2, the flexible substrate 100 include other types of wiring lines, such as power lines that supply power to the electrical elements 3.

The scanning line driver DR1 functions as a supply source that supplies scanning signals to each of the scanning lines 1. Meanwhile, the signal line driver DR2 functions as a supply source that supplies drive signals to each of the signal lines 2, or as a signal processor that processes the output signals output to each of the signal lines 2.

Figure 2:
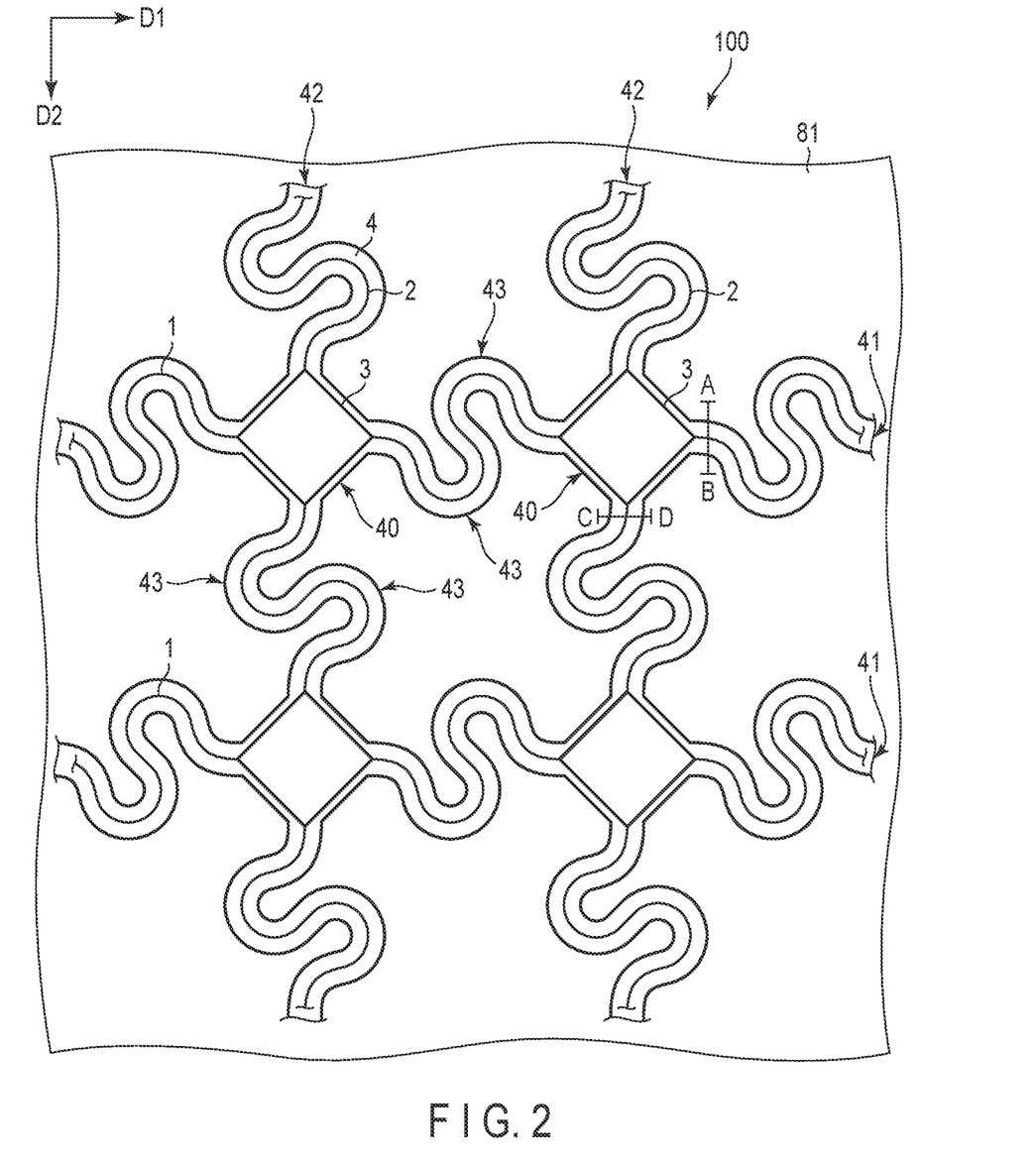
FIG. 2 is a partially enlarged plan view of the flexible substrate shown in FIG. 1.

FIG. 2 is a partially enlarged plan view of the flexible substrate 100 shown in FIG. 1.

As shown in FIG. 2, the flexible substrate 100 comprises, in addition to the above, an insulating base 4 that supports the scanning lines 1 and the signal lines 2. The insulating base 4 has elasticity and flexibility. The insulating base 4 is formed using polyimide, for example, but the material is not limited to that of this example.

The insulating base 4 includes a plurality of island-shaped portions 40, a plurality of first strip portions 41 and a plurality of second strip portions 42 which are integrated respectively with the island-shaped portions 40. The insulating base 4 is formed into a net-like shape. The plurality of island-shaped portions 40 are arranged to be spaced apart from each other in a matrix along the first direction D1 and the second direction D2. The island-shaped portions 40 are located at the respective intersections of the first strip portions 41 and the second strip portions 42. Each of the island-shaped portions 40 is formed into a quadrangular shape, for example, in plan view. The island-shaped portions 40 may be formed in other polygonal shapes or in circular or elliptical shapes. The electrical elements 3 respectively overlap the island-shaped portions 40.

The first strip portions 41 each extend generally along the first direction D1 and are aligned along the second direction D2. The first strip portions 41 connect a plurality of island-shaped portions 40 aligned in the first direction D1. The second strip portions 42 each extend generally along the second direction D2 and are aligned along the first direction D1. The second strip portions 42 connect a plurality of island-shaped portions 40 aligned along the second direction D2. The first strip portions 41 and the second strip portions 42 are each formed to be wavy in plan view. In other words, the first strip portions 41 and the second strip portions 42 are formed in a meander shape in plan view. The first strip portions 41 and the second strip portions 42 includes a plurality of tops 43 in plan view, respectively. The tops 43 correspond to peaks or troughs of the waveform.

The scanning lines 1 each extend while overlapping the first strip portions 41, respectively. The signal lines 2 each extend with while overlapping the second strip portions 42, respectively. In other words, the scanning lines 1 and the signal lines 2 are all formed in a meander shape.

Figure 3:
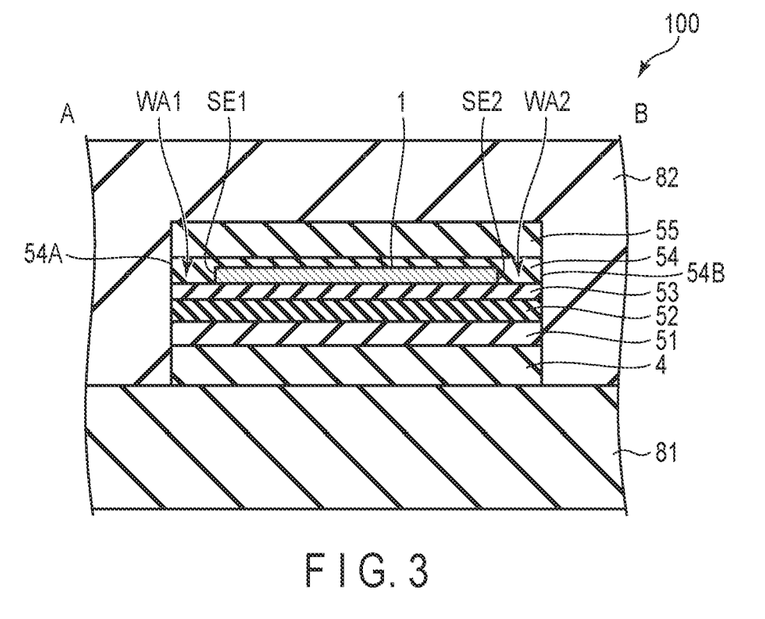
FIG. 3 is a cross-sectional view schematically showing the flexible substrate shown in FIG. 2, taken along line A-B.

FIG. 3 is a cross-sectional view of the flexible substrate 100, taken along line A-B shown in FIG. 2.

As shown in FIG. 3, the flexible substrate 100 further comprises insulating films 51 to 55 and a resin layer 82.

The insulating base 4 is located on the resin layer 81. The insulating film 51 is located on the insulating base 4. The insulating film 52 is located on the insulating film 51. The insulating film 53 is located on the insulating film 52. The scanning line 1 is located on the insulating film 53. The scanning line 1 includes a first side edge SE1 and a second side edge SE2. The insulating film (first inorganic insulating film) 54 is located on the insulating film 53 to cover the scanning line 1. The insulating film 54 covers the first side edge SE1 and the second side edge SE2. The insulating film 54 includes a first side wall WA1 in contact with the first side edge SE1 and a second side wall WA2 in contact with the second side edge SE2. The insulating film 54 includes a first end portion 54A and a second end portion 54B. The first side wall WA1 corresponds to the region between the first side edge SE1 and the first end portion 54A, and the second side wall WA2 corresponds to the region between the second side edge SE2 and the second end portion 54B. The insulating film 55 is located on the insulating film 54. The resin layer 82 covers the insulating base 4 and the insulating films 51 to 55.

The insulating films 51 to 55 are all inorganic insulating films formed of an inorganic insulating material such as silicon oxide (SiO), silicon nitride (SiN), silicon oxynitride (SiON) or the like.

Figure 4:
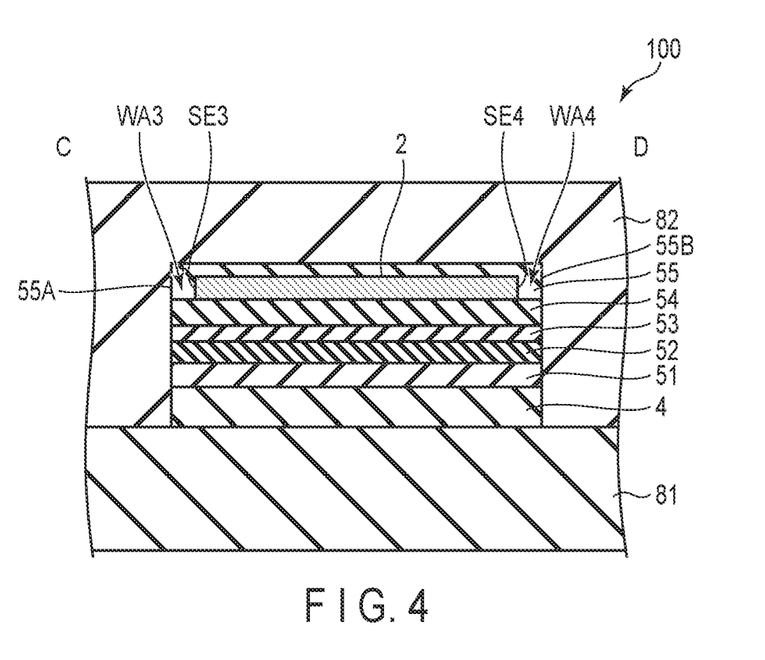
FIG. 4 is a cross-sectional view schematically showing the flexible substrate shown in FIG. 2, taken along line C-D.

FIG. 4 is a cross-sectional view of the flexible substrate 100 taken along line C-D shown in FIG. 2.

The signal line 2 is located on the insulating film 54. The signal line 2 includes a third side edge SE3 and a fourth side edge SE4. The insulating film (second inorganic insulating film) 55 is located on the insulating film 54 to cover the signal line 2. The insulating film 55 covers the third side edge SE3 and the fourth side edge SE4. The insulating film 55 includes a third side wall WA3 in contact with the third side edge SE3 and a fourth side wall WA4 in contact with the fourth side edge SE4. The insulating film 55 includes a third end portion 55A and a fourth end portion 55B. The third side wall WA3 corresponds to the region between the third side edge SE3 and the third end portion 55A, and the fourth side wall WA4 corresponds to the region between the fourth side edge SE4 and the fourth end portion 55B.

As shown in FIGS. 3 and 4, the scanning line 1, the insulating film 54, the signal line 2 and the insulating film 55 are stacked one on another in this order.

Figure 5:
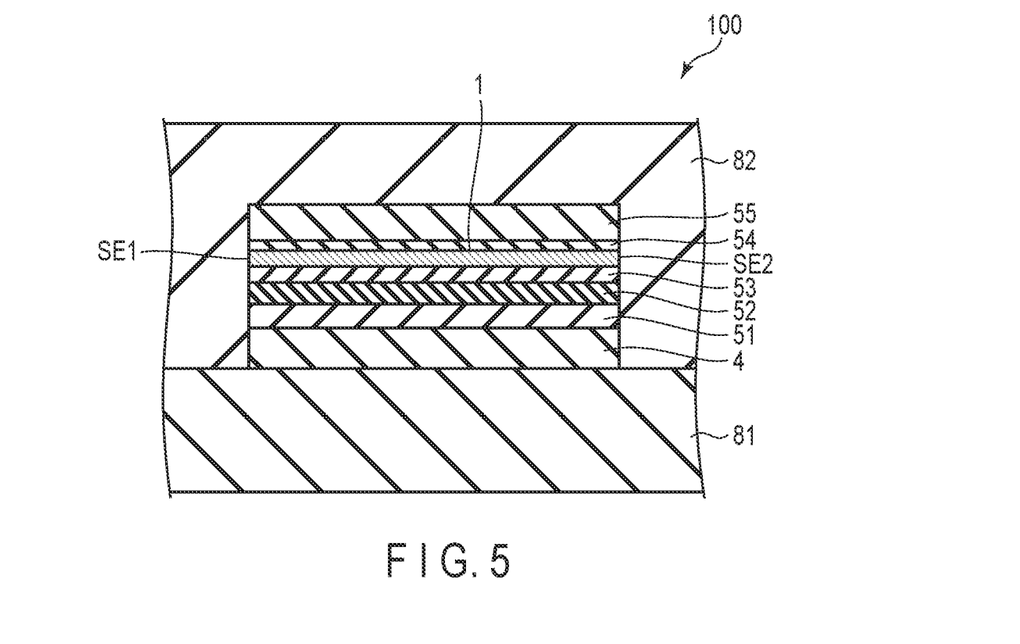
FIG. 5 is a cross-sectional view of the flexible substrate, which shoes a comparative example of the configuration shown in FIG. 3.

FIG. 5 is a cross-sectional view of the flexible substrate 100, which shows a comparative example of the configuration shown in FIG. 3. The configuration shown in FIG. 5 is different from that of FIG. 3 in the configuration of the scanning line 1.

In the comparative example shown in FIG. 5, the first side edge SE1 and the second side edge SE2 of the scanning line 1 are not covered by the insulating film 54. In the example illustrated, the first side edge SE1 and the second side edge SE2 are in contact with the resin layer 82.

Figure 6:
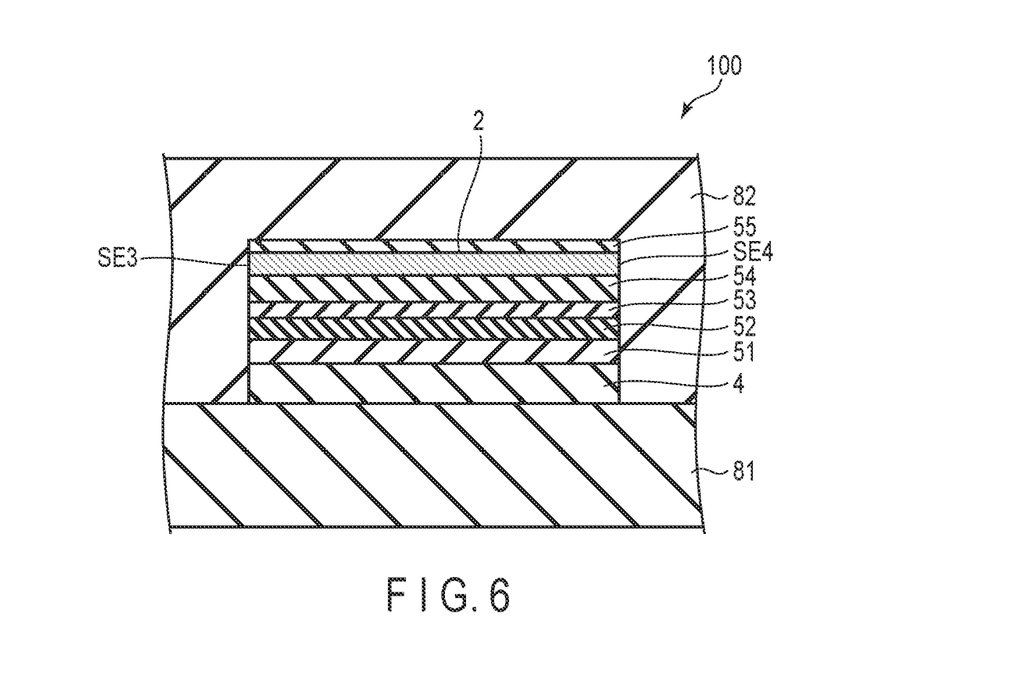
FIG. 6 is a cross-sectional view showing the flexible substrate, which shoes a comparative example of the configuration shown in FIG. 4.

FIG. 6 is a cross-sectional view of the flexible substrate 100, which shows a comparative example of the configuration shown in FIG. 4. The configuration shown in FIG. 6 is different from that of FIG. 4 in the configuration of the signal line 2.

In the comparative example shown in FIG. 6, the third side edge SE3 and the fourth side edge SE4 of the signal line 2 are not covered by the insulating film 55. In the example illustrated, the third and fourth side edges SE3 and SE4 are in contact with the resin layer 82.

Figure 7:
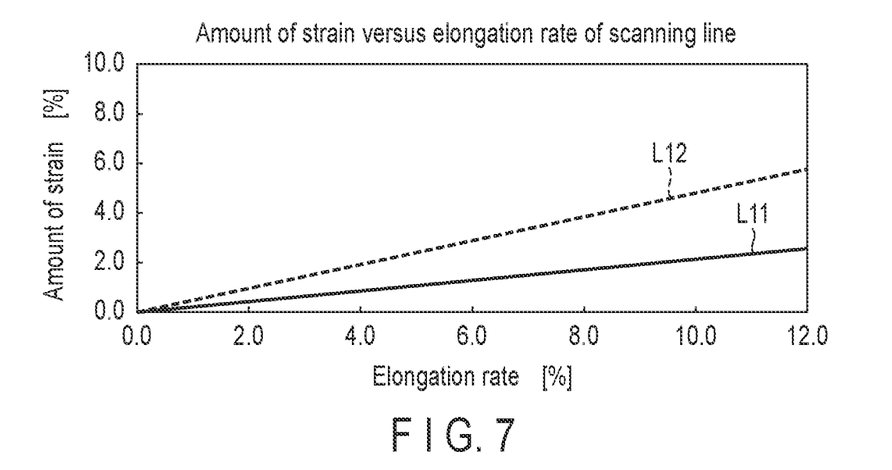
FIG. 7 is a graph showing the amount of strain versus the elongation rate of scanning lines for each of the embodiment and the comparative example.

FIG. 7 is a graph showing the amount of strain versus the elongation rate of the scanning line 1 for the present embodiment and the comparative example. The horizontal axis indicates the elongation rate of the scanning line 1 and the vertical axis represents the amount of strain of the scanning line 1.

A line L11 represents the amount of strain against the elongation rate of the scanning line 1 when the first side edge SE1 and the second side edge SE2 of the scanning line 1 are covered by the insulating film 54 as shown in FIG. 3. A line L12 represents the amount of strain with respect to the elongation rate of scanning line 1 when the first side edge SE1 and the second side edge SE2 of scanning line 1 are not covered by the insulating film 54 as shown in FIG. 5. Here, it can be understood that the amount of strain of the line L11 is decreased as compared to that of the line L12. In other words, when the flexible substrate 100 is elongated, the amount of strain of the scanning line 1 can be decreased in the configuration in which the first side edge SE1 and the second side edge SE2 of the scanning line 1 are covered by the insulating film 54, as compared to the configuration in which they are not covered.

Figure 8:
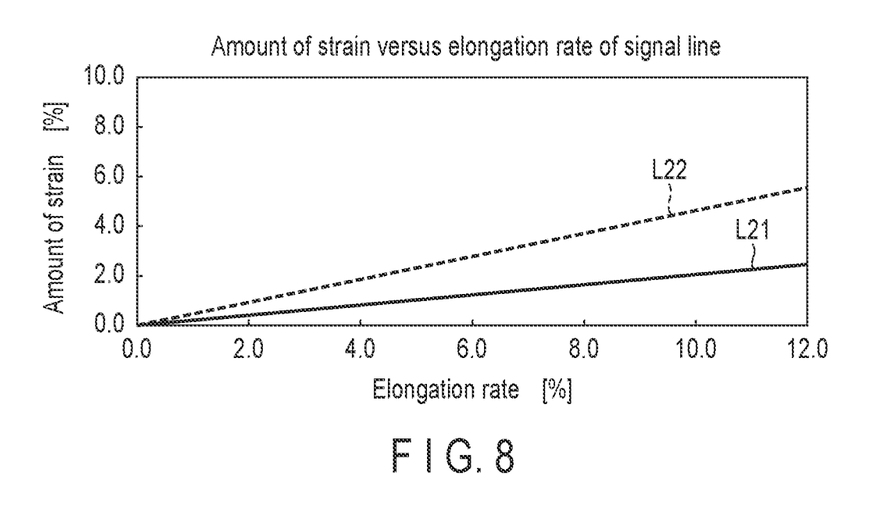
FIG. 8 is a graph showing the amount of strain versus the elongation rate of signal lines for each of the embodiment and the comparative example.

FIG. 8 is a graph showing the amount of strain versus the elongation rate of the signal line 2 for the present embodiment and the comparative example. The horizontal axis represents the elongation rate of the signal line 2 and the vertical axis represents the amount of strain of the signal line 2.

A line L21 indicates the amount of strain versus the elongation rate of the signal line 2 when the third side edge SE3 and the fourth side edge SE4 of the signal line 2 are covered by the insulating film 55 as shown in FIG. 4. A line L22 indicates the amount of strain versus the elongation rate of the signal line 2 when the third side edge SE3 and the fourth side edge SE4 of the signal line 2 are not covered by the insulating film 55 as shown in FIG. 6. Here, it can be understood that the amount of strain of line the L21 is decreased as compared to that of the line L22. In other words, when the flexible substrate 100 is elongated, the amount of strain of the scanning line 2 can be decreased in the configuration in which the third side edge SE3 and the fourth side edge SE4 of the scanning line 2 are covered by the insulating film 54, as compared to the configuration in which they are not covered.

Figure 9:
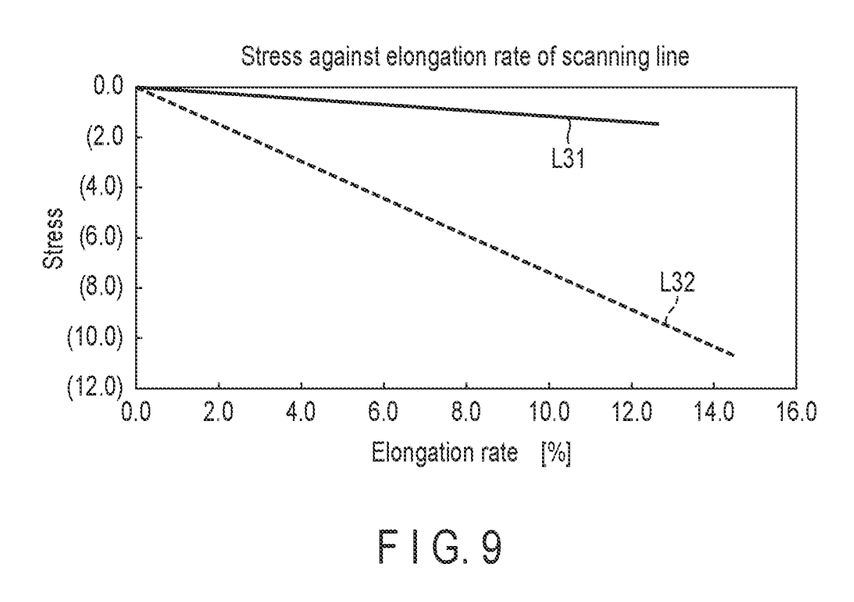
FIG. 9 is a graph showing the stress versus the elongation rate of scanning lines for each of the embodiment and the comparative example.

FIG. 9 is a graph showing the stress against the elongation rate of the scanning line 1 for the present embodiment and the comparative example. The horizontal axis indicates the elongation rate of scanning line 1 and the vertical axis indicates the stress on the scanning line 1.

A line L31 indicates the stress against the elongation rate of the scanning line 1 when the first side edge SE1 and the second side edge SE2 of the scanning line 1 are covered by the insulating film 54 as shown in FIG. 3. A line L32 indicates the stress against the elongation rate of the scanning line 1 when the first side edge SE1 and the second side edge SE2 of the scanning line 1 are not covered by the insulating film 54 as shown in FIG. 5. Here, it can be understood that the stress of the line L31 is decreased as compared to the stress of the line L32. In other words, when the flexible substrate 100 is elongated, the stress on the scanning line 1 can be decreased in the configuration in which the first side edge SE1 and the second side edge SE2 of the scanning line 1 are covered by the insulating film 54, as compared to the configuration in which they are not covered.

Note that, although the drawings thereof are omitted, results similar to those of the signal line 2 can be obtained.

According to this embodiment, the first side edge SE1 and the second side edge SE2 of the scanning line 1 are covered by the insulating film 54. Further, the third side edge SE3 and the fourth side edge SE4 of the signal line 2 are covered by the insulating film 55. With this structure, when the flexible substrate 100 is elongated, the insulating film 54 functions as a stress relaxation layer for the scanning line 1, and the amount of strain generated in the scanning line 1 can be reduced. Moreover, when the flexible substrate 100 is elongated, the insulating film 55 functions as a stress-relaxation layer for the signal line 2, and the amount of strain generated in the scanning line 2 can be reduced. Therefore, the risk of breakage in the wiring lines can be reduced.

Figure 10:
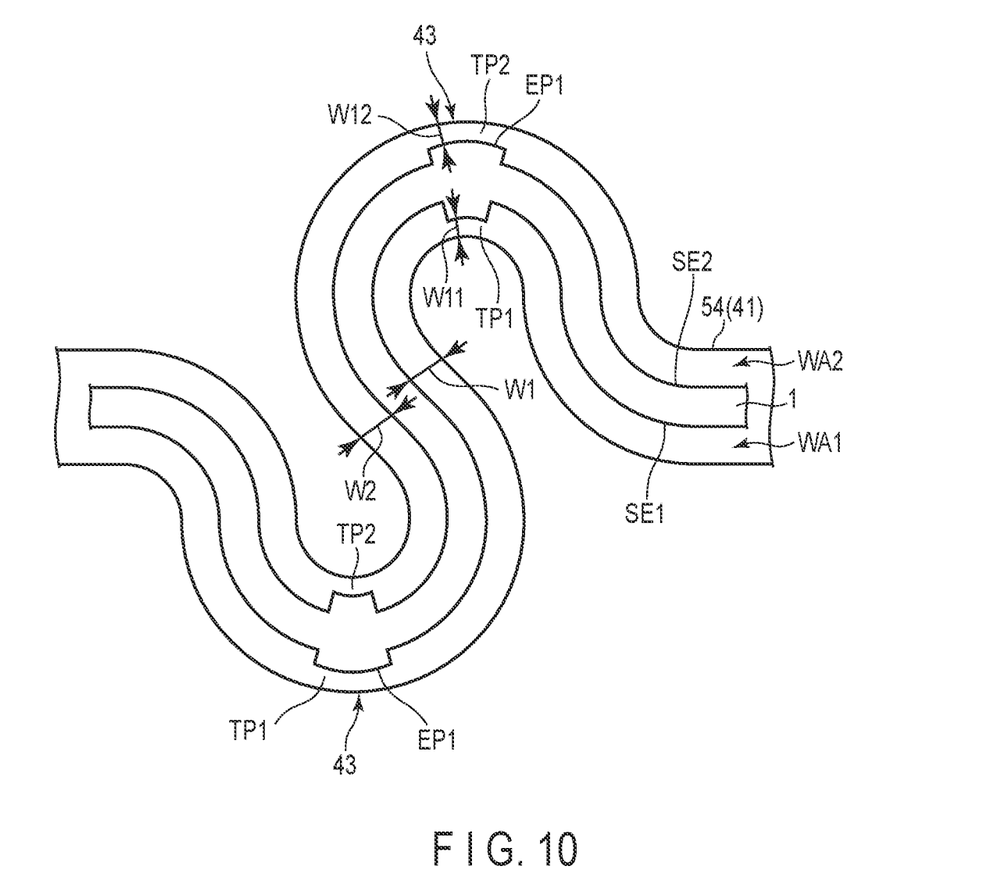
FIG. 10 is a plan view showing a scanning line and an insulating film.

FIG. 10 is a plan view of the scanning line 1 and the insulating film 54.

The insulating film 54 is formed into a strip shape which overlaps the first strip portions 41. As described above, the insulating film 54 includes a first side wall WA1 in contact with the first side edge SE1 and a second side wall WA2 in contact with the second side edge SE2. The scanning line 1 is interposed between the first side wall WA1 and the second side wall WA2.

The first sidewall WA1 includes a first thin film portion TP1 in the top 43 in plan view. Here, for example, the width of the first sidewall WA1 between two adjacent tops 43 is referred to as a width W1 and the width of the first thin film portion TP1 is referred to as a width W11. The width W11 is less than the width W1. The second sidewall WA2 includes a second thin film portion TP2 in the top 43 in plan view. Note that, for example, the width of the second sidewall WA2 between two adjacent tops 43 is referred to as a width W2, and the width of the second thin film portion TP2 is referred to as a width W12. The width W12 is less than the width W2. Here, the widths W1, W2, W11 and W12 correspond to the widths along directions that intersect the extending direction of the insulating film 54. The widths W11 and W12 are, for example, each about 5 μm or less.

The first side edge SE1 and the second side edge SE2 extend along the extending direction of the scanning line 1. The scanning line 1 includes a first expansion portion EP1 whose line width is expanded between the first thin film portion TP1 and the second thin film portion TP2.

In the configuration shown in FIGS. 3 and 4, the inorganic film covers the side edges of the wiring lines, thus making it possible to reduce the amount of strain of the wiring lines, but on the other hand, it is preferable to form the first sidewall WA1 and the second sidewall WA2 thinner because the inorganic film is highly rigid. In other words, as the widths of the first side wall WA1 and the second side wall WA2 are less, the maximum amount of strain up to the time the scanning line 1 breaks can be increased. Here, the maximum amount of strain can be rephrased as the maximum value of the amount of strain in the state where the wiring lines are not broken.

According to the configuration shown in FIG. 10, the first side wall WA1 and the second side wall WA2 are thinned in the top 43 where the amount of strain is at maximum when the flexible substrate 100 is extended. Thus, the maximum strain amount of the scanning line 1 can be increased in the top 43.

Figure 11:
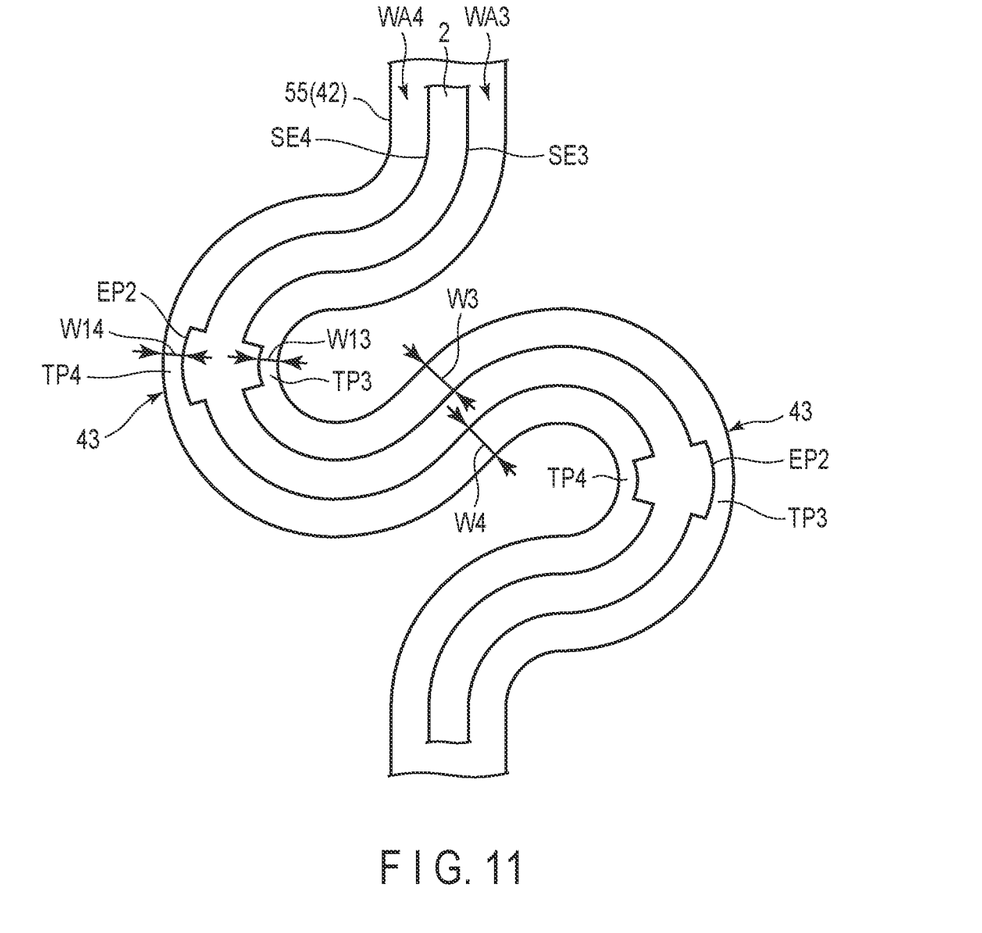
FIG. 11 is a plan view showing a signal line and an insulating film.

FIG. 11 is a plan view of the signal line 2 and insulating film 55.

The insulating film 55 is formed into a strip shape which overlaps the second strip portion 42. As described above, the insulating film 55 includes a third side wall WA3 in contact with the third side edge SE3 and a fourth side wall WA4 in contact with the fourth side edge SE4. The signal line 2 is interposed between the third side wall WA3 and the fourth side wall WA4.

The third sidewall WA3 includes a third thin film portion TP3 in the top 43 in plan view. Here, for example, the width of the third sidewall WA3 between two adjacent tops 43 is referred to as a width W3, and the width of the third thin film portion TP3 is referred to as a width W13. The width W13 is less than the width W3. The fourth sidewall WA4 includes a fourth thin film portion TP4 in the top 43 in plan view. Here, for example, the width of the fourth sidewall WA4 between two adjacent tops 43 is referred to as a width W4, and the width of the fourth thin film portion TP4 is referred to as a width W14. The width W14 is less than the width W4. Here, the widths W3, W4, W13 and W14 correspond to the widths along directions that intersect the extending direction of the insulating film 55. The widths W13 and W14 are, for example, each about 5 µm or less.

The third side edge SE3 and the fourth side edge SE4 extend along the extending direction of the signal line 2. The signal line 2 includes a second expansion portion EP2 whose line width is expanded between the third film portion TP3 and the fourth thin film portion TP4.

In the configuration shown in FIG. 11, advantageous effects similar to those of the configuration of FIG. 10 can be obtained.

As explained above, according to this embodiment, it is possible to obtain a flexible substrate that can reduce the risk of breakage in wiring lines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
   an insulating base including a plurality of first strip portions extending along a first direction and aligned along a second direction which intersects the first direction, a plurality of second strip portions extending along the second direction and aligned along the first direction, and a plurality of island-shaped portions located at respective intersections of the first strip portions and the second strip portions;
   a plurality of electrical elements overlapping the island-shaped portions, respectively;
   a plurality of scanning lines each extending while overlapping the respective first strip portion;
   a plurality of signal lines each extending while overlapping the respective second strip portion;
   a first inorganic insulating film covering the scanning lines; and
   a second inorganic insulating film covering the signal lines, wherein
   the first inorganic insulating film is formed into a strip shape which overlaps the first strip portions,
   the second inorganic insulating film is formed into a strip shape which overlaps the second strip portions,
   each of the scanning lines includes a first side edge and a second side edge extending in an extending direction of the scanning lines,
   the first inorganic insulating film covers the first side edge and the second side edge,
   each of the signal lines includes a third side edge and a fourth side edge extending in an extending direction of the signal lines, and
   the second inorganic insulating film covers the third side edge and the fourth side edge.

2. The flexible substrate of claim 1, wherein
   the first strip portions and the second strip portions are each formed into a wavy shape and include a plurality of tops.

3. The flexible substrate of claim 2, wherein
   the first inorganic insulating film includes a first sidewall in contact with the first side edge and a second sidewall in contact with the second side edge,
   the scanning line is interposed between the first sidewall and the second sidewall,
   the first sidewall includes a first thin film portion in the respective top in plan view, and
   the second sidewall includes a second thin film portion in the respective top in plan view.

4. The flexible substrate of claim 3, wherein
   the scanning lines include a first expansion portion whose line width is expanded between the first thin film portion and the second thin film portion.

5. The flexible substrate of claim 2, wherein
   the second inorganic insulating film includes a third sidewall in contact with the third side edge and a fourth sidewall in contact with the fourth side edge,
   the signal line is interposed between the third sidewall and the fourth sidewall,
   the third sidewall includes a third thin film portion in the respective top in plan view, and
   the fourth sidewall includes a fourth thin film portion in the respective top in plan view.

6. The flexible substrate of claim 5, wherein
   the signal lines include a second expansion portion whose line width is expanded between the third thin film portion and the fourth thin film portion.

7. The flexible substrate of claim 1, wherein
   the scanning line, the first inorganic insulating film, the signal line and the second inorganic insulating film are stacked in this order.

* * * * *